(12) United States Patent
Menezo

(10) Patent No.: US 10,419,123 B2
(45) Date of Patent: Sep. 17, 2019

(54) EMITTER OF A MONOCHROMATIC OPTICAL SIGNAL

(71) Applicant: Commissariat a l'energie atomique et aux energies alternatives, Paris (FR)

(72) Inventor: Sylvie Menezo, Voiron (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/181,996

(22) Filed: Nov. 6, 2018

(65) Prior Publication Data

US 2019/0181955 A1 Jun. 13, 2019

(30) Foreign Application Priority Data

Dec. 12, 2017 (FR) ...................................... 17 61985

(51) Int. Cl.
*H04B 10/00* (2013.01)
*H04B 10/50* (2013.01)
(Continued)

(52) U.S. Cl.
CPC ....... *H04B 10/5057* (2013.01); *H04B 10/675* (2013.01); *H04B 10/691* (2013.01)

(58) Field of Classification Search
CPC ... H04B 10/50; H04B 10/504; H04B 10/5057
See application file for complete search history.

(56) References Cited

U.S. PATENT DOCUMENTS

| 5,148,437 A | 9/1992 | Ohtsu |
| 9,871,343 B2 | 1/2018 | Menezo |

(Continued)

FOREIGN PATENT DOCUMENTS

| FR | 3 046 705 | 7/2017 |
| FR | 3 047 811 | 8/2017 |

OTHER PUBLICATIONS

French Preliminary Search Report dated Aug. 20, 2018 in French Application 17 61985, filed on Dec. 12, 2017 (with English Translation of Categories of Cited Documents & Written Opinion).

(Continued)

*Primary Examiner* — Daniel G Dobson
(74) *Attorney, Agent, or Firm* — Oblon, McClelland, Maier & Neustadt, L.L.P.

(57) ABSTRACT

An emitter of an optical signal includes a laser source including a control input for receiving an injection current able to modify the frequency of the optical signal, this laser source emitting the optical signal at a frequency $v_0$ in the absence of injection current, a feedback loop able to produce an injection current that is able to decrease the linewidth of the optical signal, this feedback loop including to this end an optical filter a pass band of which contains a preset operating point corresponding to a frequency $v_b$, and a loop for automatically controlling the frequency $v_b$ to the frequency $v_0$, and wherein the feedback loop includes an electrical filter that is able to selectively attenuate, in the produced injection current, the amplitude of frequency components generated by the automatic-control loop.

14 Claims, 3 Drawing Sheets

(51) Int. Cl.
*H04B 10/67* (2013.01)
*H04B 10/69* (2013.01)
*H04J 14/00* (2006.01)

(56) References Cited

U.S. PATENT DOCUMENTS

| | | | | |
|---|---|---|---|---|
| 2013/0170843 | A1* | 7/2013 | Baney | H04B 10/61 |
| | | | | 398/212 |
| 2013/0322807 | A1* | 12/2013 | Aflatouni | G02F 1/011 |
| | | | | 385/3 |
| 2017/0141852 | A1 | 5/2017 | Dubray et al. | |
| 2018/0261976 | A1 | 9/2018 | Menezo | |
| 2019/0027897 | A1* | 1/2019 | Wei | H01S 5/06223 |

OTHER PUBLICATIONS

Crozatier, V., et al. "Phase locking of a frequency agile laser", Applied Physics Letters, vol. 89, No. 26, 2006, 3 pages.

Ohtsu, M., et al. "Linewidth Reduction of a Semiconductor Laser by Electrical Feedback", IEEE Journal of Quantum Electronics, vol. QE-21, No. 12, 1985, 8 pages.

De Farias, G., et al. "Up to 64-QAM Modulation of a Silicon-Ring-Resonator-Modulator", Optical Society of America, 2014, 3 pages.

Cunningham, J., et al. "Highly-efficient thermally-tuned resonant optical filters", Optical Society of America, vol. 18, No. 18, Optics Express, 2010, 9 pages.

Satyan, N., et al. "Precisely controllable broadband frequency sweeps using a semiconductor laser in an optoelectronic phase-lock loop", Optical Society of America, 2009, 8 pages.

Mancinelli, M., et al. "Optical characterization of a SCISSOR device", Optical Society of America, vol. 19, No. 14, Optics Express, 2011, 11 pages.

Menezo, S., et al. "Advances on III-V on Silicon DBR and DFB Lasers for WDM optical interconnects and Associated Heterogeneous Integration 200mm-wafer-scale Technology", IEEE Compound Semiconductor Integrated Circuit Symposium (CSICS), 2014, 6 pages.

Shi, W., et al. "Silicon photonic grating-assisted, contra-directional couplers", Optical Society of America, vol. 21, No. 3, Optics Express, 2013, 18 pages.

* cited by examiner

EMITTER OF A MONOCHROMATIC OPTICAL SIGNAL

The invention relates to an emitter of a monochromatic optical signal.

Laser sources, and in particular semiconductor laser sources, exhibit what is known as "frequency noise". As a result of this frequency noise the frequency of a monochromatic laser has a certain frequency width $\Delta_{SL}$ at the emission frequency $v_{SL}$ of the laser source. The width $\Delta v_{SL}$ is also known as "linewidth". Typically, if nothing is done to compensate for frequency noise, the width $\Delta v_{SL}$ is generally larger than one megahertz and, most often, comprised between 1 MHz and 5 MHz or 1 MHz and 10 MHz in the case of semiconductor laser sources. The width $\Delta v_{SL}$ is here defined as being the full width at half maximum of the line of the power spectrum, i.e. the full width at half the maximum power of this line.

Such widths $\Delta v_{SL}$ are not compatible with certain applications such as for example the implementation of an FMCW (frequency-modulated continuous-wave) modulation technique. It has therefore been proposed to combine, in the same emitter, a semiconductor laser source and a feedback loop that decreases its linewidth.

Thus, known emitters of a monochromatic optical signal comprise:
a semiconductor laser source that is able to emit the optical signal at a frequency $v_{SL}$, this laser source comprising at least one control input for receiving an injection current able to modify the frequency $v_{SL}$ and at least one output via which the optical signal is emitted, this laser source emitting the optical signal at a frequency $v_0$ in the absence of injection current, and
a feedback loop able to produce an injection current that is able to decrease the linewidth of the optical signal, this feedback loop being connected, on the one hand, to the output of the laser source and, on the other hand, to the control input of the laser source in order to inject into the laser source the produced injection current, this feedback loop comprising to this end an optical filter having a pass band, this pass band being bounded at least on one side by a rising or falling edge that continuously varies over a frequency interval containing the frequency $v_0$, this edge containing a preset operating point corresponding to a frequency $v_b$ contained in this frequency interval, this optical filter being connected to the output of the laser source in order to receive the optical signal and comprising an output via which the filtered optical signal on the basis of which the injection current is produced is emitted.

For example, such known emitters are disclosed in the following articles:
Vincent CROZATIER et al.: "Phase locking of a frequency agile laser", Applied Physics Letters 89, 261115 (2006), and
Motoichi OHTSU et al.: "linewidth Reduction of a Semiconductor Laser by Electrical Feedback", IEEE Journal of Quantum Electronics, vol. QE-21, Dec. 12, 1985.

The emitter described in the article by Vincent CROZATIER is advantageous in that it allows both the frequency $v_{SL}$ to be modulated and the width $\Delta v_{SL}$ to be decreased. In this known emitter, the feedback loop comprises a Mach-Zehnder interferometer one of the arms of which is produced using an optical fibre of length L. In this emitter, the length L must be as large as possible in order to maximize the sensitivity of the feedback loop. This length L must also not be too great. Specifically, it has been shown that the pass band of the feedback loop is inversely proportional to the delay Td=n.L/c, where n is the propagation index in the optical fibre, c the speed of light and the symbol "." designates the multiplication operation. In order to obtain a feedback loop with a pass band of a few megahertz, corresponding to the linewidth of the laser before it is decreased, the delay Td is maximized to 250 ns. This corresponds to a length L of 60 meters. Thus, this known emitter is bulky. In addition, because of the length of the arms of the Mach-Zehnder interferometer, this emitter is sensitive to vibrations and to temperature variations. It is therefore necessary to stabilize its temperature and to isolate it from vibrations. Also, again because of the length of the arm of the Mach-Zehnder interferometer, the pass band of the feedback loop is limited to 2.5 MHz. Thus, if the power spectrum of the frequency noise extends over a width larger than 2.5 MHz, the latter cannot be completely removed by the feedback loop. This emitter however has the advantage of being able to operate in the presence of a modulation of the frequency of the laser source.

The emitter described in the article by Motoich OHTSU also allows the linewidth of the laser source to be decreased. In contrast, to do this, the temperature of the laser source must be automatically controlled to a temperature set point that allows its linewidth to be decreased. The mechanism for automatically controlling the temperature of the laser source is bulky. Moreover, the emitter proposed in the article by Motoichi OHTSU is incompatible with a modulation of the frequency of the laser source.

The invention aims to decrease the bulk of the known emitters of monochromatic optical signals without increasing, or indeed even decreasing, their sensitivity to temperature variations or to vibrations. Its subject is therefore such an emitter according to claim 1.

Embodiments of this emitter may comprise one or more of the features of the dependent claims.

The invention will be better understood on reading the following description, which is given merely by way of nonlimiting example and given with reference to the drawings, in which.

SECTION I: DEFINITIONS AND NOTATIONS

In these figures, the same references have been used to reference elements that are the same. In the rest of this description, features and functions that are well known to those skilled in the art will not be described in detail.

In this text, the term "connected" is used to mean either "optically connected" or "electrically connected". Below, when the type of connection, i.e. optical/electrical connection, is obvious from the context, only the term "connected" is employed without specifying whether it is an optical or electrical connection.

By power or intensity of an optical signal, what is meant, for a monochromatic optical signal, is the product of the optical field E of this optical signal multiplied by the conjugate of this optical field E. The optical field corresponds to the electric field E employed in the context of electromagnetic waves and of Maxwell's equations.

By frequency component of a signal, what is meant is a non-zero component of the power spectrum of this signal at a given frequency. A frequency component therefore corresponds to a line of the power spectrum.

By "DC component", what is meant is the frequency component of zero frequency.

SECTION II: EXAMPLE EMBODIMENTS

Figure 1:
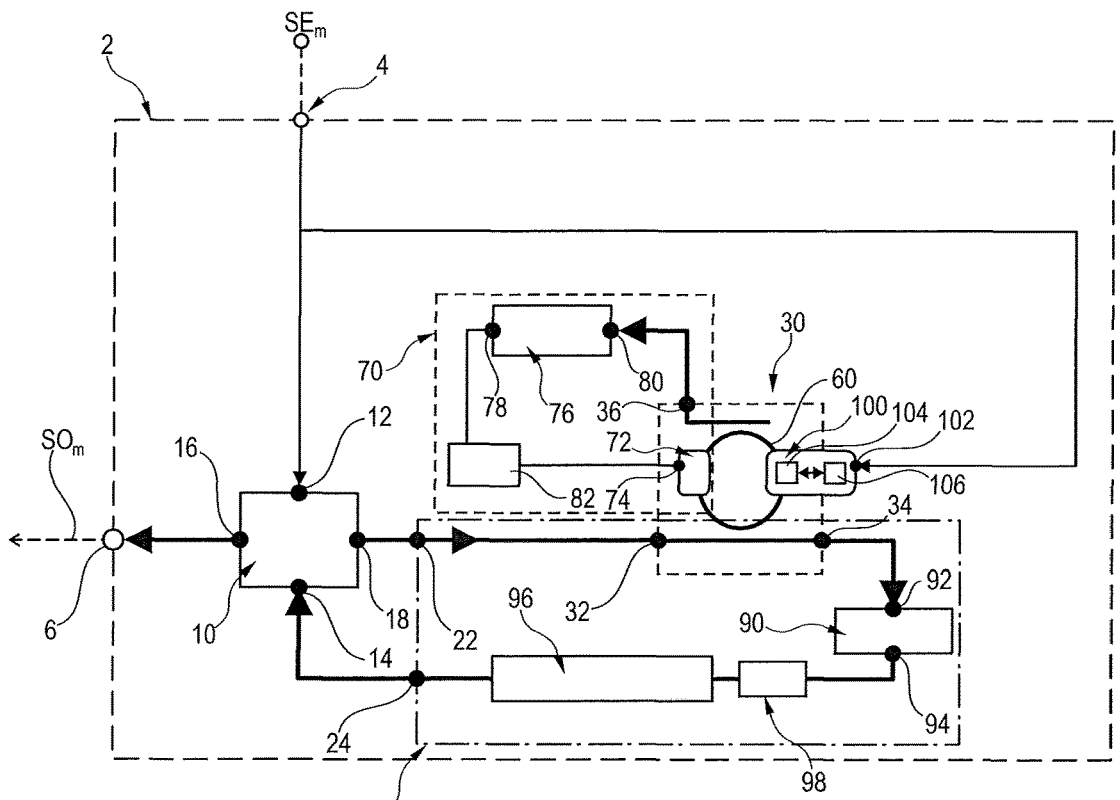
FIG. 1 is a schematic illustration of an emitter of a frequency-modulated optical signal comprising a filter.

FIG. 1 shows an emitter 2 of a frequency-modulated optical signal. The emitter 2 comprises to this end:
an input 4 intended to receive an electrical modulation signal $SE_m$, and
an output 6 via which the optical signal $SO_{m6}$ modulated depending on the signal $SE_m$ is emitted.

The emitter 2 comprises a semiconductor laser source that emits a monochromatic optical signal at the frequency $v_{SL}$. Because of frequency noise, the width $\Delta v_{SL}$ of the laser line of such a semiconductor laser source is generally comprised between 1 MHz and 10 MHz. Here, it is a few megahertz and, for example, equal to 5 MHz. For certain laser sources, this width $\Delta v_{SL}$ may reach 10 MHz.

For example, here the laser source 10 is the type of laser source known as a distributed Bragg reflector (DVR) laser.

The laser source 10 has an input 12 intended to receive the signal $SE_m$, an input 14 intended to receive an electrical injection current, a first output 16 from which the useful optical signal $SO_{m6}$ is emitted, and a second output 18 from which an optical signal $SO_{m20}$ used to decrease the width $\Delta v_{SL}$ is emitted.

The signal $SO_{m20}$ is identical to the signal $SO_{m6}$ except that its power may be different. For example, the power of the signal $SO_{m20}$ is lower than the power of the signal $SO_{m6}$. By way of illustration, the power of the signal $SO_{m20}$ is five times, and preferably ten times, lower than the power of the signal $SO_{m6}$. Here, for example, the power of the signal $SO_{m20}$ is ten times lower than the power of the signal $SO_{m6}$.

The input 12 is directly connected to the input 4 and the output 16 is directly connected to the output 6.

The signal $SE_m$ allows the frequency $v_{SL}$ to be modulated. Here, the signal $SE_m$ is an electrical current applied to the input 12 and the magnitude of which is modulated as a function of time. This modulation of the signal $SE_m$ causes a corresponding modulation or movement of the frequency $v_{SL}$. More precisely, the frequency $v_{SL}$ varies with respect to a free-running frequency $v_0$ of the laser source 10. This variation is proportional to the magnitude of the current received by the input 12. The frequency $v_0$ of the laser source 10 is the frequency of the monochromatic signal emitted by this laser source in the absence of signals received by its input 12. This frequency $v_0$ is an intrinsic characteristic of the laser source 10. The frequency $v_0$ varies only slowly, for example, depending on the exterior perturbations such as a temperature variation.

Figure 4:
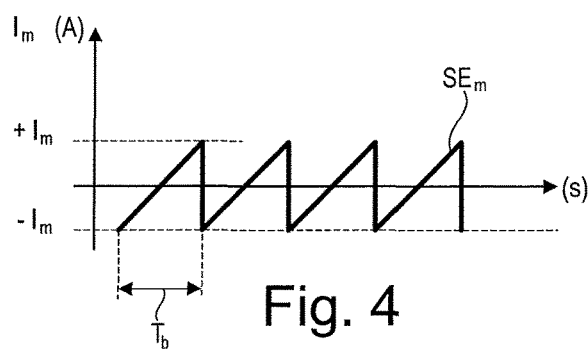
FIG. 4 is a graph illustrating the variation over time of an electrical modulation signal received by the emitter of FIG. 1.

An example of a signal $SE_m$ is shown in FIG. 4. In this figure, the y-axis is graduated in amps and the x-axis in seconds. In this example, the signal $SE_m$ is periodic and of period $T_b$. The period $T_b$ is equal to $1/f_b$, where $f_b$ is the harmonic frequency of order 1, also called the fundamental frequency, of the signal $SE_m$.

Over one period $T_b$, the signal $SE_m$ varies linearly from $-I_m$ to $+I_m$. With such a sawtooth signal, the power spectrum of the signal $SE_m$ is made up of lines at frequencies $f_b$, $3f_b$, $5f_b$, . . . , $(2n+1)f_b$, where n is an integer number. The amplitude of these lines decreases as n increases.

This frequency $f_b$ may be any frequency. However, in practice, the frequency $f_b$ is generally higher than 1 kHz, 10 kHz or 100 kHz. In this embodiment, the frequency $f_b$ is equal to 100 kHz.

To decrease the width $\Delta v_{SL}$, the emitter 2 comprises a feedback loop 20. This loop 20 comprises an input 22 that receives the signal $SO_{m20}$ and an output 24 via which an injection current produced to decrease the width $\Delta v_{SL}$ is emitted. The input 22 is connected to the output 18. The output 24 is directly connected to the input 14 of the laser source 10 in order to inject the injection current back into it.

The loop 20 comprises an optical filter 30 that is equipped with an input 32 that is directly connected to the input 22. The filter 30 comprises two outputs 34 and 36 from which are emitted filtered optical signals, $SO_{34}$ and $SO_{36}$, respectively, that are constructed from the signal $SO_{m20}$ received by the input 32.

Figure 2:
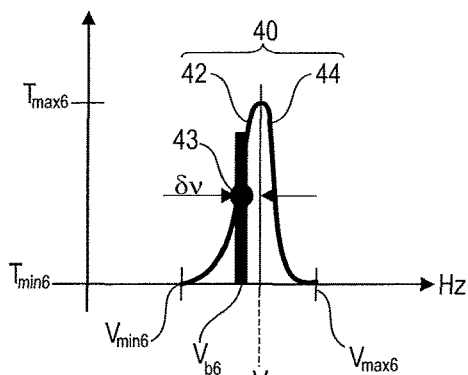
FIGS. 2 and 3 are schematic illustrations of two transmission spectra of the filter used in the emitter of FIG. 1.
Figure 3:
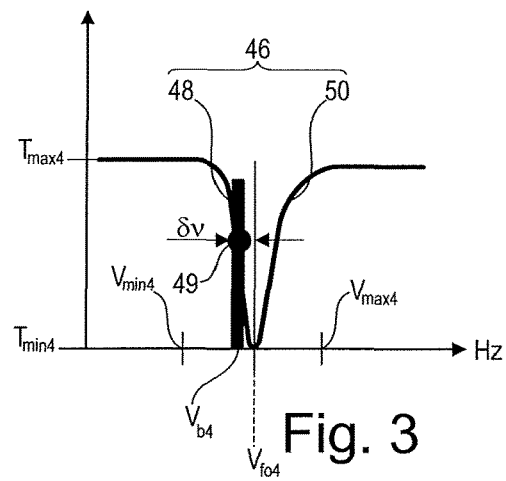

The transmission spectrum $T_{2-6}$ of the filter 30 between the input 32 and the output 36 is shown in FIG. 2. The transmission spectrum $T_{2-4}$ of the filter 30 between the input 32 and the output 34 is shown in FIG. 3. In these figures, FIGS. 2 and 3, the spectrum of the laser source 10 is also schematically shown by a single frequency component at the frequency $v_{SL}$. In these figures, the x-axis represents the optical frequency $f_{opt}$. The y-axis represents the transmission ratio of the optical power between the input 32 and the corresponding output 34 or 36 of the filter 30. Here, to simplify FIGS. 2 and 3, only those sections of the transmission spectra $T_{2-4}$ and $T_{2-6}$ that are of interest with respect to comprehension of the operation of the emitter 2 have been shown.

The spectrum $T_{2-6}$ has a maximum $T_{max6}$ at the frequency $v_{fo6}$. Here, the spectrum $T_{2-6}$ is for example a Lorentzian function centred on the frequency $v_{fo6}$. This function may be a sinusoid, a Gaussian function or a gate function, inter alfa. On either side of the frequency $v_{fo6}$, the spectrum $T_{2-6}$ has a rising and falling edge, 42 and 44, respectively. The edge 42 is a monotonic function that continuously increases from a minimum $T_{min6}$ to a maximum $T_{max6}$ over a frequency interval [$v_{min6}$; $v_{fo6}$]. The edge 44 is a monotonic function that continuously decreases from the maximum $T_{max6}$ to the minimum $T_{min6}$ over a frequency interval [$v_{fo6}$; $v_{max6}$]. Along one of the edges 42 and 44, a particular point, called the "operating point" below, is chosen. This point is particular in that the monotonic function has, at this point, desired geometric properties that are generally advantageous for the operation of the emitter 2. Here the chosen operating point corresponds to the point to which the absolute value of the slope of the edge is maximal. For example, the edges 42 and 44 each have an inflection point and the absolute value of the slope is maximal at this inflection point. Here, the operating point is chosen on the edge 42 and has been given the reference number 43. The frequency on the x-axis of the point 43 is denoted $v_{b6}$. At this point 43, the edge 42 is practically a straight line. Thus, at this point 43, the edge 42 is approximated by a linear function of the form $T=a_6 \cdot (f_{opt} - v_{b6}) + b_6$, where the coefficients $a_6$ and $b_6$ are independent of the optical frequency $f_{opt}$.

The spectrum $T_{2-4}$ has a minimum $T_{min4}$ at a frequency $v_{fo4}$. On either side of the frequency $v_{fo4}$ the spectrum $T_{2-4}$ has a rising and falling edge, 48 and 50, respectively. The edge 48 is a monotonic function that continuously decreases from a maximum $T_{max4}$ to a minimum $T_{min4}$ over a frequency interval $[v_{min4}; v_{fo4}]$. The edge 50 is a monotonic function that continuously increases from the minimum $T_{min4}$ to the maximum $T_{max4}$ over a frequency interval $[v_{fo4}; v_{max4}]$. For each of the edges 48 and 50, there is a point at which the absolute value of the slope of the edge is maximal. For example, the edges 48 and 50 each have an inflection point and the absolute value of the slope is maximal at this inflection point. Similarly to what was described above for the point 43, an operating point 49 is here chosen along the edge 48. The frequency on the x-axis of the point 49 is denoted $v_{b4}$. As for the point 43, at this point 49, the edge 48 may be approximated by a straight line. Thus, at this point 49, the edge 48 is approximated by a linear function of form $T=a_4 \cdot (f_{opt}-v_{b4})+b_4$, where the coefficients $a_4$ and $b_4$ are independent of the optical frequency $f_{opt}$.

The frequencies $v_{b4}$ and $v_{b6}$ are equal, and are denoted $v_b$ below. In addition, here, the frequencies $v_{fo4}$ and $v_{fo6}$ are also equal, and are denoted $v_{fo}$ below. In the rest of this description, the difference between the frequencies $v_b$ and $v_{fo}$ is denoted $\delta v$.

In this embodiment, the filter 30 is an optical ring resonator. Optical ring resonators are well known. In particular, the way in which the properties of the spectra $T_{2-6}$ and $T_{2-4}$ depend on the geometric parameters of the ring and of the optical buses used to couple to the ring are well known. Thus, below only a few details are given. The filter 30 comprises a ring 60, a first optical bus and a second optical bus. The ring 60 is a waveguide that forms a closed loop. The input 32 and the outputs 34, 36 correspond to the ports conventionally called the in port, the through port and the drop port, respectively. The first and second optical buses are waveguides. They are each optically coupled, generally via their intermediate portion, to the ring 60. Here, one of these buses extends between the input 32 and the output 34 and the other of these buses optically connects the output 36 to the ring 60.

In the emitter 2, the frequency $v_b$ must be equal to the frequency $v_0$. To achieve this, the emitter 2 comprises an automatic-control loop 70 allowing the spectrum $T_{2-6}$ to be positioned such that the frequency $v_b$ is equal to the frequency $v_0$. Specifically, even if at the design stage it is sought to fabricate the laser source 10 and the filter 30 such as to obtain frequencies $v_b$ and $v_0$ that are equal, because of fabrication errors, these frequencies are generally not equal. It is therefore necessary, when the emitter 2 is turned on, to align these two frequencies $v_b$ and $v_0$. Here, this is done by translating the spectra $T_{2-4}$ and $T_{2-6}$ of the filter 30 along the frequency axis.

In addition, during the operation of the emitter 2, the filter 30 and the laser source 10 may undergo perturbations that modify the position of the spectrum $T_{2-6}$ so that the frequencies $v_b$ and $v_0$ are no longer equal. It is a question of slow perturbations that affect the laser source 10 and the filter 30 differently. These perturbations are typically different variations in the temperature of the laser source 10 and the filter 30 or vibrations that affect the laser source 10 and the filter 30 differently. Here, the loop 70 generally also has the function of maintaining the position of the spectrum $T_{2-6}$ so that the frequencies $v_b$ and $v_0$ remain equal despite fabrication errors and slow perturbations.

To this end, the loop 70 includes an actuator 72 that is able to move the spectrum $T_{2-6}$ frequencywise. It is known to those skilled in the art that, since the filter 30 comprises elements that are common to the outputs 34 and 36, such as the ring 60, the spectra $T_{2-6}$ and $T_{2-4}$ systematically move frequencywise together and in the same way. Thus, the actuator 72 moves the spectra $T_{2-6}$ and $T_{2-4}$ simultaneously.

The actuator 72 comprises an input 74 for receiving an electrical control signal. The actuator 72 moves the spectrum $T_{2-6}$ depending on this electrical control signal. For example, the actuator 72 is a heater placed in proximity to a segment of the ring 60. This heater is able to heat this segment of the ring 60 in order to make the refractive index of the material that forms this ring 60 vary. Example embodiments of such a heater allowing the refractive index of a waveguide to be modified are for example described in the following article: J. E. Cunningham et al. in "Highly-efficient thermally-tuned resonant optical filters", Optical Express. August 2010. Therefore, the actuator 72 is not described in detail here.

The loop 70 also comprises a photodetector 76 capable of generating an electrical signal $SE_{78}$ that is representative of the difference between the frequencies $v_b$ and $v_0$. The photodetector 76 comprises:
an output 78 via which the signal $SE_{78}$ is emitted, and
an input 80 that is connected to the output 36 in order to receive at least a fraction of the optical signal filtered by the spectrum $T_{2-6}$ of the filter 30.
For example, the photodetector 76 is a photodiode.

Lastly, the loop 70 comprises a control circuit 82 that is capable, on the basis of the electrical signal $SE_{78}$, of generating an electrical signal $SE_{74}$ for controlling the actuator 72 that keeps the frequencies $v_b$ and $v_0$ equal. This signal $SE_{74}$ is transmitted to the input 74 of the actuator 72.

Many different embodiments of the circuit 82 are possible. For example, here, the circuit 82 includes a pre-recorded table $T_{82}$ of values and a comparator. The table $T_{82}$ includes a set of values $M_{78}$ that are each associated with a corresponding value $M_{74}$ for the signal $SE_{74}$. The values $M_{78}$ include a value $M_b$, values $M_i$ lower than the value $M_b$, and values $M_s$ higher than the value $M_b$. The value $M_b$ is equal to the value of the signal $SE_{78}$ when the frequencies $v_b$ and $v_0$ are equal. The comparator compares the signal $SE_{78}$ to the values $M_{78}$, then generates a signal $SE_{74}$ on the basis of the one or more values $M_{74}$ associated with the values $M_{78}$ closest to the actual value of the signal $SE_{78}$. When the electrical signal $SE_{78}$ is lower than the value $M_b$, the circuit 82 generates an electrical signal $SE_{74}$ that is dimensioned to shift the spectrum $T_{2-6}$ to the left. Specifically, when the spectrum $T_{2-6}$ of the filter 30 is positioned such that the frequency $v_b$ is higher than the frequency $v_0$, the optical power on the output 36 of the filter 30 is lower than $P_b$, $P_b$ being the power equal to the power of the signal $SO_{36}$ when the frequencies $v_b$ and $v_0$ are equal. The signal $SE_{78}$ then has a value $M_i$ lower than the value $M_b$. In contrast, when the signal $SE_{78}$ is higher than the value $M_b$, the circuit 82 generates a signal $SE_{74}$ that is dimensioned to shift the spectrum $T_{2-6}$ to the right.

The loop 70 is dimensioned to be effective in a frequency range $[0\ Hz, f_{c70}]$, where $f_{c70}$ is the $-3$ dB cut-off frequency of the loop 70. Given that the perturbations compensated for by the loop 70 are slow, the frequency $f_{c70}$ is low, i.e. lower than 5 kHz in the case where the perturbations are temperature variations or vibrations. Here, the frequency $f_{c70}$ is equal to 1 kHz.

To decrease the frequency noise of the laser source 10, the loop 20 uses the output 34 of the filter 30. It comprises, in addition to the filter 30, a photodetector 90. The photodetector 90 measures the power of the optical signal $SO_{34}$ transmitted to the output 34 and generates, on an output 94, an electrical signal $SE_{94}$ that is proportional to the power of the optical signal $SO_{34}$. The photodetector 90 comprises to this end an input 92 that is directly connected to the output 34. For example, the photodetector 90 is a photodiode.

In this embodiment, the output 94 is connected to the output 24 of the loop 20 only by way of an electrical filter 98 and of an amplifier 96.

The filter 98 comprises at least one stop band that removes or attenuates the DC component of the signal $SE_{94}$. This stop band therefore includes the frequency 0 Hz. In addition, the filter 98 is able to selectively remove or attenuate the amplitudes of the frequency components generated by the loop 70 in the optical signal $SO_{34}$. Specifically, the loop 70 moves the spectrum $T_{2-6}$, and therefore the spectrum $T_{2-4}$, so that the frequency $v_b$ remains equal to the current frequency $v_0$. The movements of the frequency $v_b$ by the loop 70 generate modifications in the power of the optical signal $SO_{34}$ that are not caused by frequency noise. These movements of the frequency $v_b$ occur at a frequency lower than the frequency $f_{c70}$. Therefore, the frequency components generated by the loop 70 are essentially comprised in the range [0 Hz; $f_{c70}$]. In this embodiment, the portion of the frequency spectrum of the signal $SO_{34}$ mainly generated by the loop 70 is considered to extend continuously over this range [0 Hz; $f_{c70}$]. Under these conditions, by way of illustration, the filter 98 is a high-pass electrical filter the −3 dB cut-off frequency $f_{c98}$ of which is higher than or equal to the frequency $f_{c70}$. Generally, the frequency $f_{c98}$ is lower than one megahertz and/or the frequency $f_b$. Preferably, this frequency $f_{c98}$ is comprised between $f_{c70}$ and $1.3f_{c70}$ or between $f_{c70}$ and $1.1f_{c70}$. Here, the filter 98 is placed before the amplifier 96 between the output 94 and the output 24 in order to attenuate the frequency components produced by the loop 70 in the signal $SO_{34}$.

By virtue of the filter 98, the modifications of the power measured by the photodetector 90 that are caused by the loop 70 are not compensated for by the loop 20. The loop 20 therefore does not neutralize the operation of the loop 70. In addition, the loop 20 remains able to decrease the width $\Delta v_{SL}$ because the portion of the power spectrum of the signal $SO_{34}$ generated by the frequency noise is mainly located beyond the frequency $f_{c70}$. Therefore, the filter 98 does not prevent the width $\Delta v_{SL}$ from being decreased.

The amplifier 96 multiplies the electrical signal output from the filter 98 by a gain G2. Here, given that the edge 48 is a falling edge, to obtain negative feedback, the gain G2 is positive.

The loop 20 is dimensioned to be effective in a frequency range [$f_{c98}$, $f_{c20}$], where $f_{c20}$ is the cut-off frequency of the loop 20. Typically, to effectively decrease the width $\Delta v_{SL}$, the frequency $f_{c20}$ is chosen to be higher than or equal to $\Delta v_{SL0}/2$ or $\Delta v_{SL0}$, where $\Delta v_{SL0}$ is the width $\Delta v_{SL}$ of the line of the laser source 10 in the absence of the loop 20. Preferably, the frequency $f_{c20}$ is also chosen to be lower than or equal to $1.2\Delta v_{SL0}/2$ or $1.2\Delta v_{SL0}$. Thus, the frequency $f_{c20}$ is generally comprised between 0.5 MHz and 10 MHz or 12 MHz. Here, if the width $\Delta v_{SL0}$ is considered to be 5 MHz, the frequency $f_{c20}$ is for example chosen to be equal to 5 MHz.

Under these conditions, the frequency noise of the laser source 10 comprised between 1 kHz and 5 MHz is cancelled out via the following mechanism. An increase in the frequency $v_0$ with respect to the frequency $v_b$ results in a decrease in the optical power of the signal $SO_{34}$ received by the photodetector 90. The electrical current output from the photodetector 90 is therefore decreased. The injection current injected into the input 14 is also decreased. This decrease in the injection current gives rise to a decrease in the frequency $v_0$, which allows the frequency $v_b$ to be approached. A decrease in the frequency $v_0$ with respect to the frequency $v_b$ results in an increase in the optical power of the signal $SO_{34}$ received by the photodetector 90. The electrical current output from the photodetector 90 is therefore increased. The injection current is also increased. This increase in the injection current gives rise to an increase in the laser frequency $v_0$, which therefore allows the frequency $v_b$ to be approached.

If nothing in particular is done, at least certain of the frequency components of the signal $SO_{m6}$ that are caused by the frequency modulation are removed or greatly attenuated by the loop 20 for the same reason as the frequency noise of the laser source 10. Specifically, the fundamental frequency $f_b$, and here also the frequencies $3f_b$, $5f_b$ ... etc. of the signal $SE_m$ are comprised in the frequency range [$f_{c98}$, $f_{c20}$]. Therefore, if nothing is done to avoid it, the frequency components of the signal $SE_m$ at frequencies lower than the frequency $f_{c20}$ will be unable to modulate the frequency $v_{SL}$ because they are cancelled out by the loop 20.

In this embodiment, to achieve both a modulation of the frequency $v_0$ and a decrease in the width $\Delta v_{SL}$, the emitter 2 comprises a modulator 100 that is capable of modulating the spectrum $T_{2-4}$, and therefore the spectrum $T_{2-6}$, of the filter 30 in the same way as the signal $SE_m$ modulates the frequency $v_{SL}$ of the laser source 10. By "in the same way", what is meant is the fact that the frequency $v_b$ moves at the same speed, with the same amplitude and at the same time as the frequency $v_{SL}$ of the laser source 10.

For this purpose, the modulator 100 comprises a control input 102 that receives the signal $SE_m$. The input 102 is directly connected to the input 4 of the emitter 2. The modulator 100 comprises:

an actuator 104 able to move the spectra $T_{2-4}$ and $T_{2-6}$ of the filter 30 in response to an electrical control signal $SE_{106}$, and a control circuit 106 able, on the basis of the signal $SE_m$, to generate the signal $SE_{106}$ that allows the spectra $T_{2-4}$ and $T_{2-6}$ to be moved in the same way as the frequency $v_{SL}$ is moved.

For example, the actuator 104 comprises a p-n junction produced in a section of the ring 60 and electrodes allowing the charge-carrier density to be varied level with this p-n junction. A variation in the charge-carrier density level with the p-n junction allows the refractive index of the ring 60 to be rapidly varied and therefore the spectra $T_{2-4}$ and $T_{2-6}$ to be rapidly moved. This technique is for example described in the following article: Giovanni Beninca de Farias et al. "Up to 64-QAM Modulation of a Silicon-Ring-Resonator-Modulator", OSA 2014. Those skilled in the art will therefore be able to produce the actuator 104 and the circuit 106. Said actuator and circuit are therefore not described in more detail here.

Here, just like the loop 70, the modulator 100 moves the spectra $T_{2-4}$ and $T_{2-6}$ at the same time.

Since the frequency $v_b$ is modulated in the same way as the frequency $v_{SL}$, the loop 20 does not remove variations in the frequency $v_{SL}$ caused by the frequency modulation. Thus, the emitter 2 is able at the same time to modulate the frequency $v_{SL}$ and durably decrease the width $\Delta v_{SL}$.

Preferably, to further increase the compactness of the emitter 2 and, at the same time, decrease its sensitivity to vibrations, all of the aforementioned optical components of the emitter 2 are here produced on the same substrate. For example, these optical components are produced using the same conventional fabrication processes as those used to fabricate photonic components on silicon. Thus, the laser source 10, the filter 30 and the photodetectors 76 and 90 are integrated into the same chip or die. For example, the fabrication process used is that described in the following article: S. Menezo et al: "Advances on III-V on Silicon DBR and DFB Lasers for WDM Optical Interconnects and Associated Heterogeneous Integration 200 mm-Wafer-Scale Technology", Compound Semiconductor Integrated Circuit Symposium (CSICs), 2014 IEEE.

Figure 5:
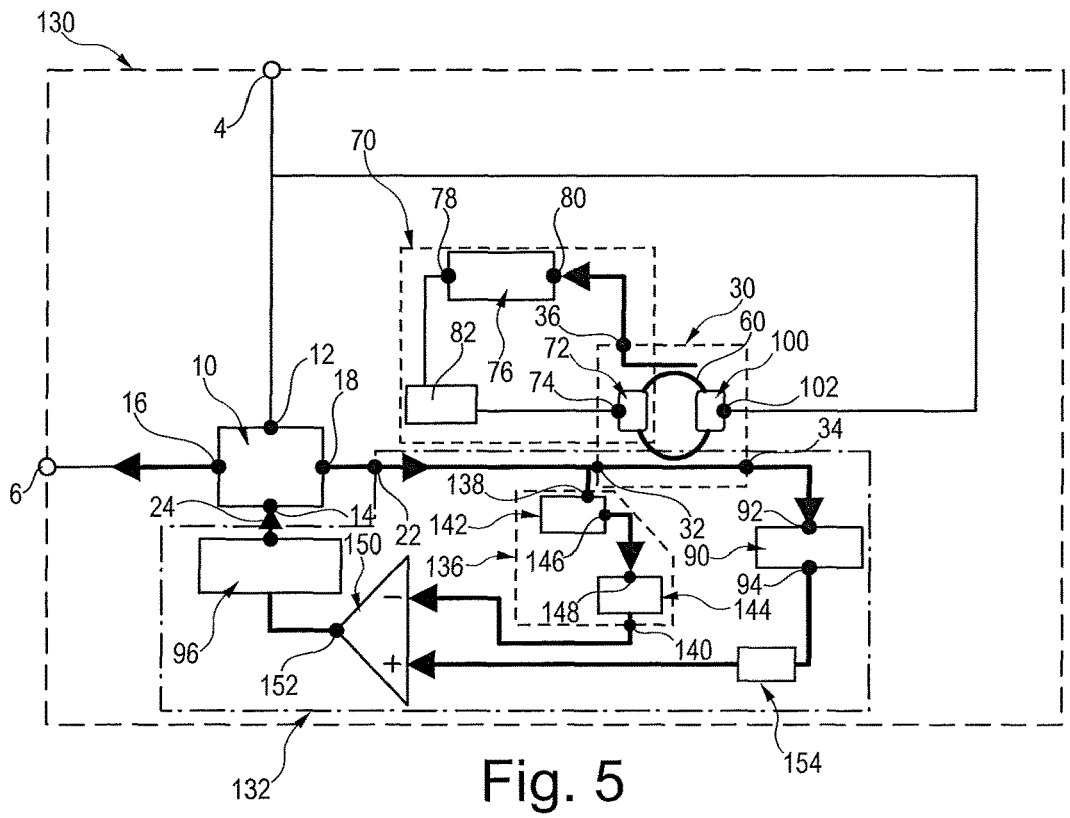
FIGS. 5 and 6 are schematic illustrations of other embodiments of the emitter of FIG. 1.

FIG. 5 shows an emitter 130 that is identical to the emitter 2, except that the loop 20 has been replaced by a loop 132. The loop 132 is identical to the loop 20 except that the loop 132 comprises other components for removing the DC component of the optical power of the signal $SO_{34}$ and only preserving the contribution of the frequency noise. Moreover, when frequency noise that results in a width $\Delta v_{SL}$ exists, there exists at the same time intensity noise that makes the intensity of the line of the laser source vary at the frequency $v_{SL}$. Furthermore, when the frequency of the laser source is modulated, there exists a residual modulation of the optical intensity thereof. If nothing is done, this intensity noise and residual modulation of the laser intensity modify the magnitude of the injection current, this modification of the injection current not contributing to the decrease in the width $\Delta v_{SL}$. In this embodiment, the loop 132 is in addition designed to attenuate, or even remove, intensity noise and residual intensity modulation.

For this purpose, the loop 132 comprises a component 136 that delivers an electrical reference signal $SE_{140}$ representing the laser optical power, the intensity noise and the residual intensity modulation. This component 136 comprises an input 138 that is connected to the input 22 in order to receive the signal $SO_{m20}$ and an output 140 via which the electrical signal $SE_{140}$ is emitted. The magnitude of the signal $SE_{140}$ is dependent on, and preferably equal to, the power of the laser line, its intensity noise, and the residual modulation of intensity under the effect of the signal $SE_{m20}$. For example, the component 136 comprises to this end:
a variable optical attenuator 142 or VOA, and
photodetector 144.

The attenuator 142 attenuates the power of the signal $SO_{m20}$. It comprises an input that is directly connected to the input 138 in order to receive the signal $SO_{m20}$. The input 138 is connected to the input 22 at a point before the signal $SO_{m20}$ passes through the filter 30. It will be recalled here that, conventionally, the power of the optical signal $SO_{34}$ is attenuated with respect to the power of the optical signal $SO_{m20}$ received by the input 32.

The attenuator 142 also comprises an output 146 from which is emitted an attenuated optical signal $SO_{146}$ the power of which has been attenuated. Here, the attenuator 142 is adjusted so that the attenuation coefficient of the attenuator 142 is equal to the attenuation coefficient of the filter 30. The attenuation coefficient of an optical component is here defined as being equal to the measured power of the optical signal output from this optical component divided by the measured power of the optical signal input into the same optical component.

The output 146 is connected to an input 148 of the photodetector 144. The photodetector 144 converts the power of the signal $SO_{146}$ into an electrical signal that is here called "signal $SE_{140}$", which was introduced above. The signal $SE_{140}$ is then emitted by way of the output 140. The signal $SE_{140}$, contrary to the signal $SE_{94}$, is independent of variations in the frequency $v_b$ of the filter 30. In other words, the signal $SE_{94}$ is the sum of an electrical signal equal to the signal $SE_{140}$ and of an electrical signal that is dependent on the frequency noise of the laser source and on the variations associated with the loop 70.

In this embodiment, the filter 98 is replaced by a filter 154. The filter 154 removes or attenuates only the amplitude of the frequency components of the induction current that are produced by the loop 70. For example, the filter 154, contrary to the filter 98, does not necessarily attenuate or attenuate much the DC component of the produced induction current. In this embodiment, the DC component is removed by a subtractor that is described below.

To this end, for example, the filter 154 comprises a low-pass pass band and a high-pass pass band that are separated from each other by a stop band. Inside the stop band, the attenuation of the frequency components of the produced injection current is higher than −3 dB. For example, the high-pass pass band is identical to the pass band of the filter 98. The low-pass pass band has a −3 dB cut-off frequency lower than 100 Hz or 50 Hz.

The output 140 and the output of the filter 154 are connected to respective inputs of a subtractor 150.

The subtractor 150 subtracts the magnitude of the current generated by the photodetector 144 from the magnitude of the current generated by the filter 154 and emits from an output 152 an injection current the magnitude of which is the result of this subtraction. The output 152 is connected to the output 24 of the loop 132 by way of the amplifier 96. The injection current thus constructed only compensates for the frequency noise of the laser source.

Figure 6:
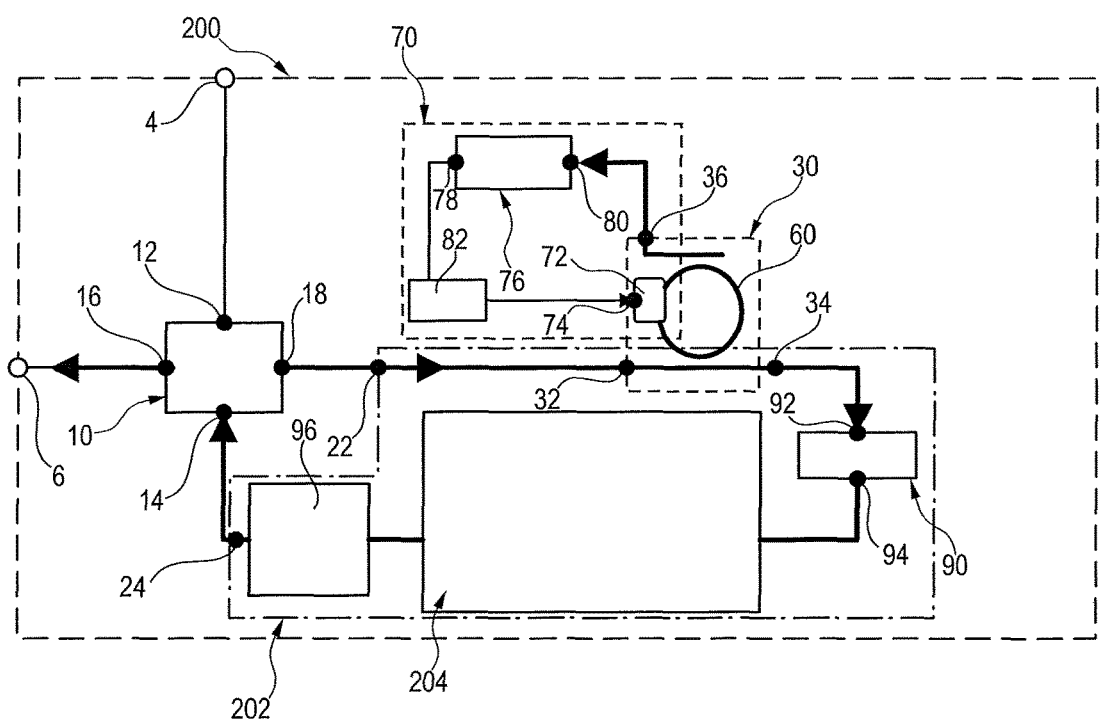

FIG. 6 shows an emitter 200 that implements a strategy other than that described above in order to prevent the feedback loop from compensating for the frequency components generated by the modulation of the frequency $v_{SL}$. More precisely, the strategy implemented in this embodiment consists in selectively removing or attenuating, using the electrical filter, the amplitude of the frequency components of the produced injection current that are caused by the modulation of the frequency $v_{SL}$.

The emitter 200 is here identical to the emitter 2, except that the loop 20 is replaced by a loop 202 and the modulator 100 is omitted. The loop 202 is identical to the loop 20, except that the filter 98 has been replaced by an electrical filter 204.

The filter 204 is designed to selectively attenuate the amplitude of the frequency components of the injection current at the fundamental frequency $f_b$ and at the harmonics of the signal $SE_m$. In the particular case of the signal $SE_m$ described with reference to FIG. 4, the harmonics of the signal $SE_m$ are uneven integer multiples of the fundamental frequency $f_b$. Hence, the filter 204 is a comb filter. The transmission spectrum 206 of the filter 204 is shown in FIG. 7.

Figure 7:
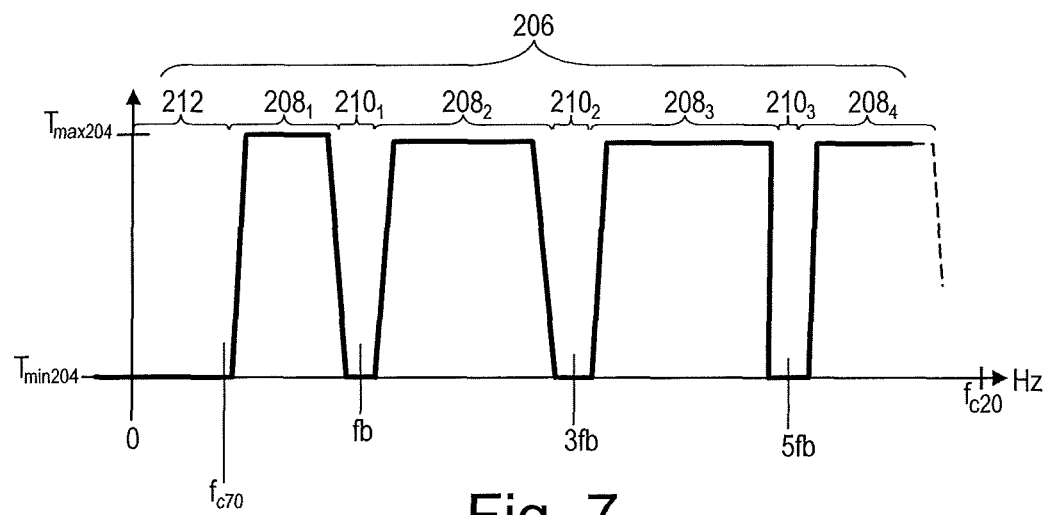
FIG. 7 is a schematic illustration of the pass band of an electrical filter employed in the embodiment of FIG. 6.

In FIG. 7, the x-axis is graduated in hertz and the y-axis represents the transmission ratio of the electrical power between the input and output of the filter 204. The spectrum 206 varies between a minimum value $T_{min204}$ and a maximum value $T_{max204}$. In FIG. 7, the dashed line that terminates the spectrum 206 indicates that only the start of this spectrum has been shown. The spectrum 206 comprises a multitude of pass bands $208_i$ that are spaced apart from one another by stop bands $210_i$. The index i is a number indicating order. In the interior of the stop bands $210_i$, the attenuation of the electrical signal is higher than −3 dB. The stop bands $210_i$ are each centred on an uneven integer multiple of the fundamental frequency $f_b$. For example, each stop band $210_i$ is comprised between $0.8(2k+1)f_b$ and $1.2(2k+1)f_b$ and, preferably, between $0.9(2k+1)f_b$ and $1.1(2k+1)f_b$, where k is an integer equal to i−1.

Here, the filter 204 is in addition designed to play the same role as that of the filter 98. To this end, the spectrum 206 in addition comprises a stop band 212 that extends between 0 Hz and a cut-off frequency higher than or equal to the frequency $f_{c70}$.

In this embodiment, since the frequency components generated by the modulation of the frequency $v_{SL}$ are removed from the injection current produced by the loop 202, this loop 202 does not compensate for this modulation. Therefore, this embodiment also allows the frequency $v_{SL}$ to be modulated while at the same time durably decreasing the width $\Delta v_{SL}$ of the line at the frequency $v_{SL}$.

Figure 8:
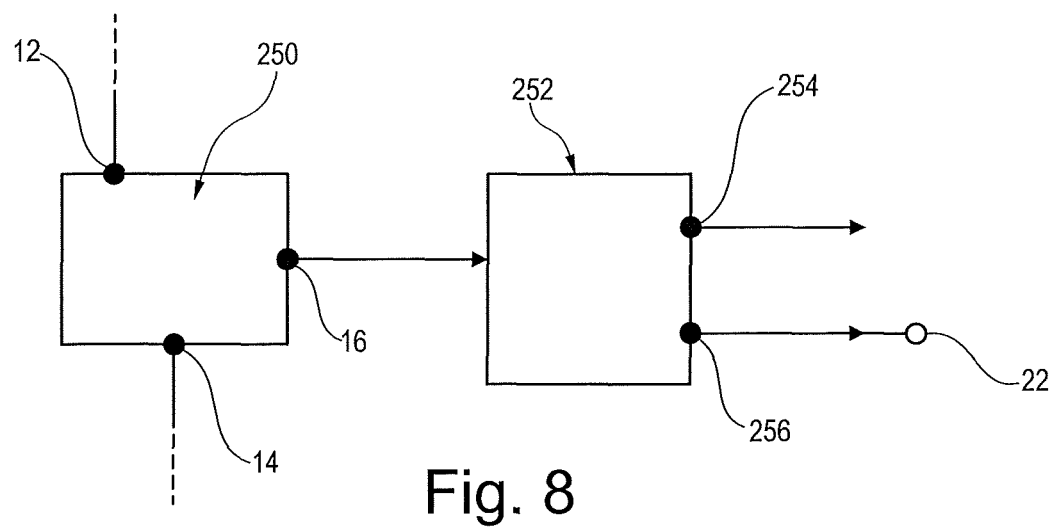
FIG. 8 is a schematic illustration of another embodiment of a laser source able to be employed in the emitter of FIG. 1.

The laser source may be a DBR laser source but also a DFB (distributed feedback) laser source. These two laser sources may have only a single optical output. FIG. 8 shows such a laser source 250 that comprises only a single optical output, i.e. here the output 16. This laser source 250 comprises the same inputs 12 and 14. In this case, to use the laser source 250 instead of the laser source 10 in any one of the emitters described here, an optical power splitter 252 is connected to the output 16 of the laser source 250. The splitter 250 splits the optical signal $SO_{m16}$ emitted by the output 16 into two optical signals that are identical but, optionally, of different powers. One of these optical signals is emitted by an output 254 and the other by an output 256 of the splitter 252. The power ratio between the optical signals emitted by the outputs 254 and 256 is chosen depending on the requirements to be between 0.0001 and 0.9999. For example, the power ratio is the same as that described for the signals $SO_{m6}$ and $SO_{m20}$. Thus, when the laser source 250 and the divider 252 replace the laser source 10, it is the output 256 that is connected to the input 22 of the feedback loop.

Variants of the Laser Source:

All that has been described here is applicable to semiconductor laser sources other than a DBR or DFB laser source, provided that it is possible to modulate its frequency using a current such as the injection current described here. For example, the laser source may be a vertical-cavity surface-emitting laser (VCSEL).

The inputs 12 and 14 have been described up to now as being separate inputs of the laser source. However, these inputs 12 and 14 may be merged so that the signal $SE_m$ and the produced injection current are injected into the laser source via the same input. In this case, the emitter for example comprises a summer that is able to add the produced injection current to the signal $SE_m$ before the result of this sum is injected into the input of the laser source.

In other embodiments, the power of the signal $SO_{m20}$ is higher than the power of the signal $SO_{m6}$. For example, the power of the signal $SO_{m20}$ is five times or ten times higher than the power of the signal $SO_{m6}$. This allows the width $\Delta v_{SL}$ to be further decreased. More generally, the power ratio between the signals $SO_{m6}$ and $SO_{m20}$ is chosen to be between 0.0001 and 0.9999 depending on the requirements.

Variants of the Automatic-Control Loop:

Other embodiments of the actuator 72 are possible. For example, another technique consists in modifying the charge-carrier density in the waveguide that forms the ring 60, and therefore the refractive index of the waveguide. This technique is for example described in the following article: Giovanni Beninca de Farias et al. "Up to 64-QAM Modulation of a Silicon-Ring-Resonator-Modulator", OSA 2014.

In another variant, the loop 70 uses the same actuator as that of the modulator 100 and not the actuator 72. In this case, the modulator 100 comprises a summer or an amplifier-summer that adds the electrical signals generated by the circuits 82 and 106, respectively, before sending the result of this summation to the input of the actuator 104. In this case, the actuator 72 may be omitted.

The loop 70 may operate using the optical signal filtered using the falling edge, instead of the rising edge, of the filter 30. In this case, the loop 70 in addition comprises an inverter for inverting the electrical signal measured by the photodetector 76.

The loop 70 may use an additional optical filter that is independent of the filter 30 to generate an optical signal the power of which is representative of the difference between the frequencies $v_b$ and $v_0$. For example, this additional filter is identical to the filter 30 and connected, in parallel, to the output 18. In this case, the loop 70 is not connected to the output 36 of the filter 30 but to the output of this additional filter. The additional filter is associated with an additional actuator that is identical to the actuator 72. The signal $SE_{74}$ generated by the circuit 82 is transmitted both to the input 74 of the actuator 72 and to the control input of the additional actuator.

As a variant, the photodetector 76 is connected to the output 34 of the filter 30 instead of being connected to the output 36. In this case, for example, the table $T_{82}$ must be modified accordingly. Specifically, the signals $SO_{34}$ and $SO_{36}$ are complementary. Typically, the signal $SO_{36}$ is the inverse of the signal $SO_{34}$. It is therefore necessary to adapt the loop 70 to this inversion of the input signal.

Variants of the Feedback Loop:

The loop 20 may be dimensioned so that its frequency $f_{c20}$ is lower than the width $\Delta v_{SL0}$.

As variants, instead of using the falling edge of the optical filter 30 to obtain the optical signal $SO_{34}$, it is the rising edge of the optical filter that is used. In this case, for example, to obtain negative feedback, the feedback loop in addition comprises an electrical inverter that inverts the sign of the electrical signal measured by the photodetector 90. For example, to this end, the amplifier 96 is replaced by an amplifier-inverter.

The filter 98 or 154 or 204 may be placed elsewhere in the feedback loop. For example, it may be placed after the amplifier 96.

Each electrical filter may be composed of a single electrical filter or of a plurality of electrical filters connected in series.

Depending on the embodiment of the loop 70, that portion of the power spectrum of the signal $SO_{34}$ which is mainly generated by this loop 70 may take the form of a line or a succession of lines that are separate and comprised between 0 Hz and $f_{c70}$. The fundamental component of that portion of the spectrum which is generated by the loop 70 is denoted $F_{lock}$, and the harmonics of order higher than one of this portion of the spectrum are denoted $kF_{lock}$, where k is a integer number strictly higher than one indicating order. In this case, the filter 98 may be replaced by a comb filter that comprises at least a first and second stop band that are spaced apart from each other by a pass band. The first stop band contains the frequency 0 Hz and the second stop band contains the frequency $F_{lock}$. This comb filter may in addition comprise additional stop bands centred on certain of the harmonics $kF_{lock}$. In the same case, similarly, the filter 154 may also be replaced with the same comb filter except that the first stop band may be omitted. Again in this case, the stop band 212 may be replaced by a plurality of separate stop bands centred on 0 Hz and $F_{lock}$ and, optionally, on a plurality of the harmonics $kF_{lock}$.

In a simplified variant of the filter 204, with the exception of the stop band $210_1$, the other stop bands $210_i$ may be omitted. Specifically, the amplitude of the frequency components of the spectrum of the signal $SE_m$ at the harmonics, other than the fundamental frequency, is generally much lower. Thus, their removal by the loop 20 is not necessarily a problem.

Variants Common to the Automatic-Control and Feedback Loops:

Other embodiments of the optical filter are possible. For example, the optical filter may take other forms than that of a ring-resonator-based filter. Thus, by way of illustration, the filter 30 may be replaced by the type of filter known as a grating-assisted contra-directional coupler (GACC). Such GACC filters are well known to 30 those skilled in the art. They are for example described in the following article: Wei Shi, et al.: "Silicon photonic grating-assisted, contra-directional couplers" Vol. 21, No. 3, OPTICS EXPRESS 3633, Nov. 2, 2013. The input and outputs of a GACC filter have the same names as those described for the filter 30 and are used in the same way.

In another embodiment, the filter 30 is replaced by a filter employing a plurality of rings. Such a filter comprising a plurality of rings is described in the following article: Mattia Mancinelli, et al.: "Optical characterization of a SCISSOR device", Vol. 19, No. 14, Optics EXPRESS 13664, Apr. 7, 2011. Once again, the ports used have the same names as those described for the filter 30 and are used in the same way.

It is also possible to use an optical filter the pass band of which comprises a single rising edge or a single falling edge. For example, the optical filter is in this case a high-pass or low-pass optical filter. The emitter then operates as described above except that there is only a single rising or falling edge.

As variants, the operating point does not correspond to the point for which the absolute value of the slope of the edge of the transmission spectrum is maximal. For example, the operating point is chosen differently and corresponds to another point of the rising or falling edge at which the slope is not maximal. As another variant, it is not necessary for the operating point to correspond to an inflection point of the rising or falling edge.

The removal of the DC component, of the intensity noise and of the residual intensity modulation of the signal $SO_{34}$ such as described in the case of the emitter 130 may be implemented in all the other embodiments described here.

The embodiment described with reference to FIG. 6 may be combined with any of the other embodiments comprising the modulator 100. In this case, the obtained embodiment removes the frequency components of the produced induction current at the integer multiples of the fundamental frequency $f_b$ both using the modulator 100 and the filter 204.

Other Variants:

As a variant, the emitter 2 comprises the input 4 and an additional input that is itself also intended to receive the signal $SE_m$. In this case, for example, the input 12 of the laser source 10 is only connected to the input 4 and the input 102 of the modulator 100 is only connected to this additional input. In order for this emitter to operate correctly, the electrical signal $SE_m$ is then transmitted to the input 4 and to this additional input simultaneously.

The embodiments have been described in the particular case of an emitter of a frequency-modulated optical signal. However, all that has been described here applies to the case of an emitter of an optical signal that is not frequency modulated. When the frequency $v_{SL}$ is not modulated, the modulator 100 and the stop bands $210_i$ of the filter 204 can be omitted. In the case where the frequency $v_{SL}$ is not modulated, it is possible to make the loop 70 operate only intermittently. For example, the loop 70 is only activated during an initialization phase of the emitter. Subsequently, the loop 70 is turned off. When it is turned off, it no longer acts on the optical filter 30.

The component 136 and subtractor 150 may be implemented in feedback loops designed to decrease the width $\Delta v_{SL}$ independently of the loop 70. For example, this component 136 and this subtractor 150 may be implemented in an emitter identical to that of FIG. 5 but in which the loop 70 is omitted. This is for example possible if the temperature of the laser source 10 and of the filter 30 is stabilized by a cooling circuit that keeps it constant. When the loop 70 is omitted, it is not necessary for the feedback loop to comprise a filter that selectively attenuates or removes the frequency components produced by this loop 70.

The filter 204 and/or the modulator 100 may be implemented independently of the loop 70. For example, in all the embodiments described here, the loop 70 may be omitted. As indicated above, this is entirely possible if the slow perturbations that affect the filter 30 are negligible.

Advantages of the Described Embodiments

The use of the loop 70 to compensate for differences between the frequencies $v_b$ and $v_0$ due to slow perturbations such as a temperature variation or vibrations allows the operation of the emitter to be stabilized without making recourse to more complex and bulky means for attenuating these perturbations. For example, it is not necessary to use a cooler to keep the temperature of the optical filter equal to the temperature of the laser source.

In addition, the fact of using an optical filter the pass band of which comprises an edge located on the frequency $v_0$ allows a physical quantity representative of the difference between the frequencies $v_b$ and $v_0$ to be extracted using an optical component that is much more compact than a Mach-Zehnder lattice one of the arms of which is 60 m long.

The fact of using a given filter to remove from the injection current the DC component and frequency components lower than or equal to the frequency $f_{c70}$ allows production of the emitter to be simplified.

The fact of using the same filter 30 to generate the optical signal the power of which is measured by the photo detectors 76 and 90, respectively, limits the number of components of the emitter.

The use of the modulator 100 and/or of the electrical filter 204 allows the frequency components generated by the frequency modulation to be withdrawn from the produced injection current. Thus, the feedback loop does not cancel out and does not compensate for the modulation of the frequency $v_{SL}$ caused by the signal $SE_m$. It is therefore possible both to decrease the width $\Delta v_{SL}$ while modulating the frequency $v_{SL}$. In addition, this works even if the fundamental frequency of the signal $SE_m$ is lower than the cut-off frequency $f_{c20}$ of the feedback loop.

Using a ring resonator allows the bulk of the emitter to be further limited. Specifically, a ring resonator, despite providing an equal performance, is smaller than, for example, a GACC filter.

The use of the component 136 and of the subtractor 150 allows an injection current to be produced the magnitude of which is practically independent of intensity noise and of residual intensity modulation liable to exist in parallel to the frequency noise. This improves the operation of the emitter and in particular allows the width $\Delta v_{SL}$ to be further decreased.

Choosing as operating point the point of the edge of the optical filter at which the absolute value of the slope is maximal allows the sensitivity of the loops 20 and 70 to be increased.

The invention claimed is:
1. An emitter of a monochromatic optical signal, said emitter comprising:
    a semiconductor laser source configured to emit the optical signal at a frequency $v_{SL}$, said laser source comprising at least one control input for receiving an injection current configured to modify the frequency $v_{SL}$ and at least one output via which the optical signal is emitted, said laser source emitting the optical signal at a frequency $v_0$ in the absence of injection current, and
    a feedback loop configured to produce an injection current configured to decrease the linewidth of the optical signal, said feedback loop being connected to the output of the laser source and to the control input of the laser source in order to inject into the laser source the produced injection current, said feedback loop comprising an optical filter having a transmission spectrum comprising a pass band, said pass band being bounded, in the transmission spectrum, at least on one side by a rising or falling edge that continuously varies over a frequency interval containing the frequency $v_0$, said edge containing an operating point that is located at a preset position along the edge and that corresponds to a frequency $v_b$ contained in the frequency interval, said optical filter being connected to the output of the laser source in order to receive the optical signal and comprising an output via which the filtered optical signal on the basis of which the injection current is produced is emitted,
    wherein:
    the emitter comprises, in addition to the feedback loop, an automatic-control loop for automatically controlling the frequency $v_b$ to the frequency $v_0$, and
    the feedback loop comprises an electrical filter that is configured to selectively attenuate, in the produced injection current, the amplitude of the frequency components generated by the automatic-control loop.
2. The emitter according to claim 1, wherein the electrical filter is also configured to attenuate the DC component of the electrical signal, the attenuation of the DC component of the electrical signal being higher than −3 dB.
3. The emitter according to claim 1, wherein the electrical filter has a stop band inside of which the attenuation of the electrical signal is higher than −3 dB, said stop band extending continuously from a low frequency to a high frequency, the low frequency being equal to 0 Hz or lower than 100 Hz and the high frequency being comprised in the interval [$f_{c70}$; $1.3f_{c70}$], where $f_{c70}$ is the −3 dB cut-off frequency of the automatic-control loop.
4. The emitter according to claim 1, wherein the electrical filter has a stop band inside of which the attenuation of the electrical signal is higher than −3 dB, said stop band extending continuously from a low frequency to a high frequency, the low frequency being comprised in an interval [$0.7F_{lock}$; $0.98F_{lock}$] and the high frequency being comprised in an interval [$1.02F_{lock}$; $1.3F_{lock}$], where Flock is the fundamental frequency of that portion of the spectrum of the filtered optical signal which is generated by the automatic-control loop.
5. The emitter according to claim 1, wherein the automatic-control loop comprises:
    an actuator comprising a control input, said actuator being configured to induce a movement of the edge of the pass band of the optical filter depending on the control signal received by its control input,
    a photodetector configured to generate an electrical signal representative of the difference between the frequencies $v_b$ and $v_0$, and
    a control circuit able configured, on the basis of the electrical signal representative of the difference between the frequencies $v_b$ and $v_0$, to generate, on the control input of the actuator, a control signal that induces a movement of the edge of the pass band of the optical filter, decreasing said difference between the frequencies $v_b$ and $v_0$.
6. The emitter according to claim 5, wherein the photodetector is connected to the same output or to another output of the optical filter so as to generate an electrical signal representative of the difference between the frequencies $v_b$ and $v_0$.
7. The emitter according to claim 1 and configured, in addition, to modulate the frequency of the optical signal, wherein:
    the laser source is configured to receive an electrical modulation signal and, in response, to move the frequency of the optical signal depending on the received electrical modulation signal, and
    the emitter in addition comprises
        a modulator comprising a control input that is intended to receive the electrical modulation signal, said modulator being configured to induce a movement of the edge of the pass band of the optical filter that is identical to the movement applied to the frequency $v_{SL}$ of the optical signal when the electrical modulation signal received by its control input is identical to the electrical modulation signal received by the laser source, or
        the electrical filter is also configured to selectively attenuate, in the produced injection current, at least the amplitude of a frequency component at a frequency $f_b$, where the frequency $f_b$ is the fundamental frequency of the electrical modulation signal.
8. The emitter according to claim 7, wherein the electrical filter comprises a comb filter having a plurality of pass bands that are spaced apart from one another by stop bands in which the attenuation of the electrical signal is higher than −3 dB, each of these stop bands containing a respective integer multiple of the frequency $f_b$.
9. The emitter according to claim 1, wherein the optical filter comprises a ring resonator.
10. The emitter according to claim 1, wherein the preset operating point is the point of the edge of the transmission spectrum for which the absolute value of the slope of said edge is maximal.
11. The emitter according to claim 1, wherein the feedback loop comprises:
    a component configured to generate an electrical signal, called the "reference signal", that is representative of the power of the optical signal before the latter is filtered by the optical filter, said component comprising:
        a power attenuator equipped:
            with an input that is connected to the output of the laser source upstream of the optical filter, and
            with an output from which is delivered an optical signal that is identical, to within a power attenuation coefficient, to the signal received by its input, said power attenuation coefficient of the attenuator being equal to the attenuation coefficient of the optical filter, and a photodetector that is connected to the output of the attenuator and that includes an output from which is emitted the reference electrical signal obtained on the basis of the attenuated optical signal delivered from the output of the attenuator, and a subtractor configured to subtract, from the produced injection current, said reference electrical signal.

12. The emitter according to claim 1, wherein, in the transmission spectrum, the edge of the pass band of the optical filter is a falling edge.

13. The emitter according to claim 1, wherein the feedback loop comprises a photodetector that is configured to convert the filtered optical signal into a measured electric signal that is proportional to the power of the filtered optical signal and on the basis of which the injection current is produced, said photodetector being connected to the output of the optical filter in order to receive the filtered optical signal and comprising an output from which the measured electrical signal is emitted.

14. The emitter according to claim 1, wherein the laser source and the optical filter are fabricated in and integrated into the same substrate.

* * * * *